United States Patent
Rabe (10) Patent No.: US 11,676,652 B2
(45) Date of Patent: Jun. 13, 2023

(54) WORDLINE BOOST DRIVER

(71) Applicant: Honeywell International Inc., Charlotte, NC (US)

(72) Inventor: Robert Rabe, Chanhassen, MN (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/450,227

(22) Filed: Oct. 7, 2021

(65) Prior Publication Data

US 2022/0189528 A1  Jun. 16, 2022

Related U.S. Application Data

(60) Provisional application No. 63/199,260, filed on Dec. 16, 2020.

(51) Int. Cl.
| | |
|---|---|
| *G11C 11/408* | (2006.01) |
| *G11C 11/4074* | (2006.01) |
| *G11C 11/4076* | (2006.01) |
| *G11C 7/22* | (2006.01) |
| *G11C 5/14* | (2006.01) |

(52) U.S. Cl.
CPC .......... *G11C 11/4085* (2013.01); *G11C 5/145* (2013.01); *G11C 7/22* (2013.01); *G11C 11/4074* (2013.01); *G11C 11/4076* (2013.01); *G11C 11/4082* (2013.01)

(58) Field of Classification Search
CPC .......... G11C 11/4085; G11C 11/4074; G11C 11/4076; G11C 11/4082; G11C 5/145; G11C 8/08; G11C 5/063; G11C 7/22
See application file for complete search history.

(56) References Cited

U.S. PATENT DOCUMENTS

| | | | |
|---|---|---|---|
| 6,137,343 A | * | 10/2000 | Matano ................. G11C 5/145 |
| | | | 327/535 |
| 6,873,561 B2 | | 3/2005 | Ooishi |
| 7,508,698 B2 | | 3/2009 | Houston |
| 7,636,254 B2 | | 12/2009 | Ehrenreich et al. |
| 8,988,921 B2 | | 3/2015 | Romanovskyy |
| 9,324,392 B1 | | 4/2016 | Asenov et al. |
| 9,583,163 B2 | | 2/2017 | Tiwari et al. |
| 9,940,997 B2 | | 4/2018 | Kumar et al. |
| 10,002,654 B2 | * | 6/2018 | Kulkarni ............... G11C 11/418 |
| 2019/0035455 A1 | | 1/2019 | Fujiwara et al. |
| 2020/0135269 A1 | | 4/2020 | Hsieh et al. |

OTHER PUBLICATIONS

Iijima et al., "Low Power SRAM with Boost Driver Generating Pulsed Word Line Voltage for Sub-1V Operation," Journal of Computers, vol. 3, No. 5, May 2008, pp. 34-40.

* cited by examiner

*Primary Examiner* — Kretelia Graham
(74) *Attorney, Agent, or Firm* — Shumaker & Sieffert, P.A.

(57) ABSTRACT

An example apparatus for writing a bit to a memory cell includes wordline driver circuitry configured to generate a first voltage in response to a row access enable signal. The apparatus also includes boost driver circuitry coupled to the wordline driver circuitry. The boost driver circuitry is configured to charge a capacitor using the first voltage and to generate a second voltage using the first voltage and a voltage at the capacitor in response to a boost enable signal. The apparatus also includes a wordline coupled to the memory cell and the wordline driver circuitry. The wordline is configured to output the first voltage or the second voltage to the memory cell.

17 Claims, 8 Drawing Sheets

WORDLINE BOOST DRIVER

PRIORITY CLAIM

This application claims benefit to U.S. Provisional Application No. 63/199,260, filed Dec. 16, 2020, the entire contents of which is incorporated herein by reference.

STATEMENT REGARDING FEDERALLY SPONSORED RESEARCH OR DEVELOPMENT

This invention was made with Government support under Contract Number FA9453-19-C-0010 awarded by Air Force Research Laboratory. The Government has certain rights in the invention.

TECHNICAL FIELD

The disclosure relates to computer memory circuitry.

BACKGROUND

A typical memory cell array contains a wordline driver circuit on each cell row to control the row select signal to the memory cells in that row. A conventional wordline driver circuit is designed to charge and discharge the relatively large capacitive load of many cells between a source voltage Vss and a drain voltage Vdd during an access operation. With some types of memory, it is advantageous to charge the wordline to a voltage different than the standard Vss or Vdd value. Charging the wordline to a different voltage may be desirable, for example, in order to increase a signal level, reduce delay, perform a write operation versus a read operation or other reasons. Typically, charging the wordline to a different voltage is accomplished by adding another voltage supply domain to the wordline driver circuit at the desired additional voltage.

SUMMARY

In general, this disclosure describes an apparatus for writing a bit to a memory cell. The apparatus uses self-timed capacitive boosting rather than another voltage supply domain. The apparatus includes wordline driver circuitry and boost driver circuitry. The wordline driver circuitry is configured to generate a first voltage. The boost driver circuitry is configured to generate a second voltage that is higher than the first voltage and includes a capacitor for generating the second voltage. The apparatus includes an output that is configured to output the first voltage before the expiration of a first delay after the apparatus receives a row access signal and output the second voltage after the expiration of a second delay after the apparatus receives the row access signal. During the first delay, a wordline may be brought up to the first voltage and a wordline driver transistor may be turned off at the expiration of the first delay. The second delay may be provided to provide a time so that the wordline driver transistor and the boost driver circuitry may not overlap in attempting to drive the wordline at the first voltage or the second voltage. The first delay and the second delay may be associated with first delay circuitry and second delay circuitry, respectfully.

In one example of the disclosure, an apparatus for writing a bit to a memory cell includes wordline driver circuitry configured to generate a first voltage in response to a row access enable signal, boost driver circuitry coupled to the wordline driver circuitry and being configured to charge a capacitor using the first voltage and to generate a second voltage using the first voltage and a voltage at the capacitor in response to a boost enable signal, wherein the second voltage is higher than the first voltage, and a wordline coupled to the memory cell and the wordline driver circuitry, the wordline being configured to output the first voltage or the second voltage to the memory cell, wherein the wordline driver circuitry comprises delay circuitry configured to output the first voltage at the wordline before expiration of a first delay from receiving the row access enable signal and to output the second voltage after expiration of a second delay from receiving the row access enable signal.

In another example, a method for writing a bit to a memory cell includes generating, by wordline driver circuitry, a first voltage in response to a row access enable signal; charging, by boost driver circuitry, a capacitor using the first voltage; generating, by the boost driver circuitry, a second voltage using the first voltage and a voltage at the capacitor in response to a boost enable signal, wherein the second voltage is higher than the first voltage; outputting, by a wordline coupled to the memory cell and the wordline driver circuitry, the first voltage to the memory cell before expiration of a first delay from receiving the row access enable signal; and outputting, by the wordline, the second voltage to the memory cell after expiration of a second delay from receiving the row access enable signal.

In another example, a memory system includes a capacitor, wordline driver circuitry configured to generate a first voltage in response to a row access enable signal, boost driver circuitry coupled to the wordline driver circuitry and the capacitor and being configured to charge the capacitor using the first voltage and to generate a second voltage using the first voltage and a voltage at the capacitor, wherein the second voltage is higher than the first voltage, and a wordline coupled to a memory cell and the wordline driver circuitry, the wordline being configured to output the first voltage or the second voltage to the memory cell, wherein the wordline driver circuitry comprises delay circuitry configured to output the first voltage at the wordline before expiration of a first delay from receiving the row access enable signal and to output the second voltage after expiration of a second delay from receiving the row access enable signal.

The details of one or more examples of the disclosure are set forth in the accompanying drawings and the description below. Other features, objects, and advantages of the disclosure will be apparent from the description and drawings, and from the claims.

DETAILED DESCRIPTION

Memory circuits and other circuits sometimes include internal signal voltages other than a drain voltage, which may be referred to herein as "Vdd" or a source voltage, which may be referred to herein as "Vss." For example, a memory circuit may use a second voltage greater than the drain voltage to increase a signal level, reduce a delay in performing a write operation and/or a read operation, perform a write operation instead of a read operation, or for other reasons. The conventional approach to providing a higher voltage signal is to add a drain voltage domain at the desired voltage level. However, adding this drain voltage domain may add significant system cost and complexity.

According to the techniques of this disclosure, an apparatus is described for writing a bit to a memory cell without adding a drain voltage domain to provide the desired voltage level. Instead, an example apparatus provides the desired voltage level through self-timed capacitive boosting. Multiple signal driver elements are designed to successively develop the intended voltage level through capacitive boosting, self-timing, distribution and sharing of resources, and control methods for communication between voltage levels. According to the techniques of this disclosure, the example apparatus may provide advantages of a boosted word-line voltage with an adjustable amplitude and duration. This combination of features may help to mitigate electrical overstress and associated risk of early wear out of components of memory cells and associated circuitry. The techniques of this disclosure may avoid the use of an elevated drain voltage, thus preventing the risk of catastrophic latch-up. Latch-up is essentially a short circuit that may occur with complementary metal oxide semiconductor (CMOS) transistors. The techniques of this disclosure may also reduce the size, cost and risk of a magnetic random access memory (MRAM) implementation. The techniques of this disclosure may additionally facilitate a faster write time and improved retention over traditional wordline driver circuits. The techniques of this disclosure may also result in higher manufacturing yield.

The techniques of this disclosure may be applicable to MRAM, other types of RAM, or other memory. Recently, complementary metal-oxide-semiconductor (CMOS) technology has advanced more quickly than MRAM technology. The gate oxides for CMOS transistors have become very small such that the operating voltages are generally lower than one volt. Sustained higher voltages may damage the transistors. However, a higher current may be needed to write a bit than may be present when the gate voltages are lower than one volt.

MRAM memory operation requires application of a minimum current and voltage within each memory cell in order to write the memory element to an intended logical state (e.g., high (1) or low (0)). Applying this minimum current and voltage to a memory cell requires an associated minimum field effect transistor (FET) device size within each memory cell. By boosting the voltage of the wordline signal and associated FET gates of the memory cells beyond the normal drain voltage during the write operation, the FET device size within the memory cell may be reduced, thereby reducing overall memory circuit area. A boosted write current may also facilitate faster write time and improved retention of the voltage within the memory cell. The use of a boosted voltage may also be advantageous for other modes, benefits and applications. Using a boosted voltage may include the possibilities of latch-up and electrical overstress. According to the techniques of this disclosure, an example apparatus is provided with techniques to mitigate or eliminate these risks and provide advantageous operating features, such as providing for delayed boosting of the voltage and a controlled decay back to the unboosted voltage.

A wordline driver is described herein that uses self-timed capacitive coupling or 'boost' to achieve a desired output voltage level, rather than an additional supply domain. Also, because the capacitive load on the driver is large, the size of the boost capacitance tends to be relatively large. The techniques of this disclosure mitigate the large capacitive load by sharing the large boost capacitance among multiple drivers or loads.

Figure 1:
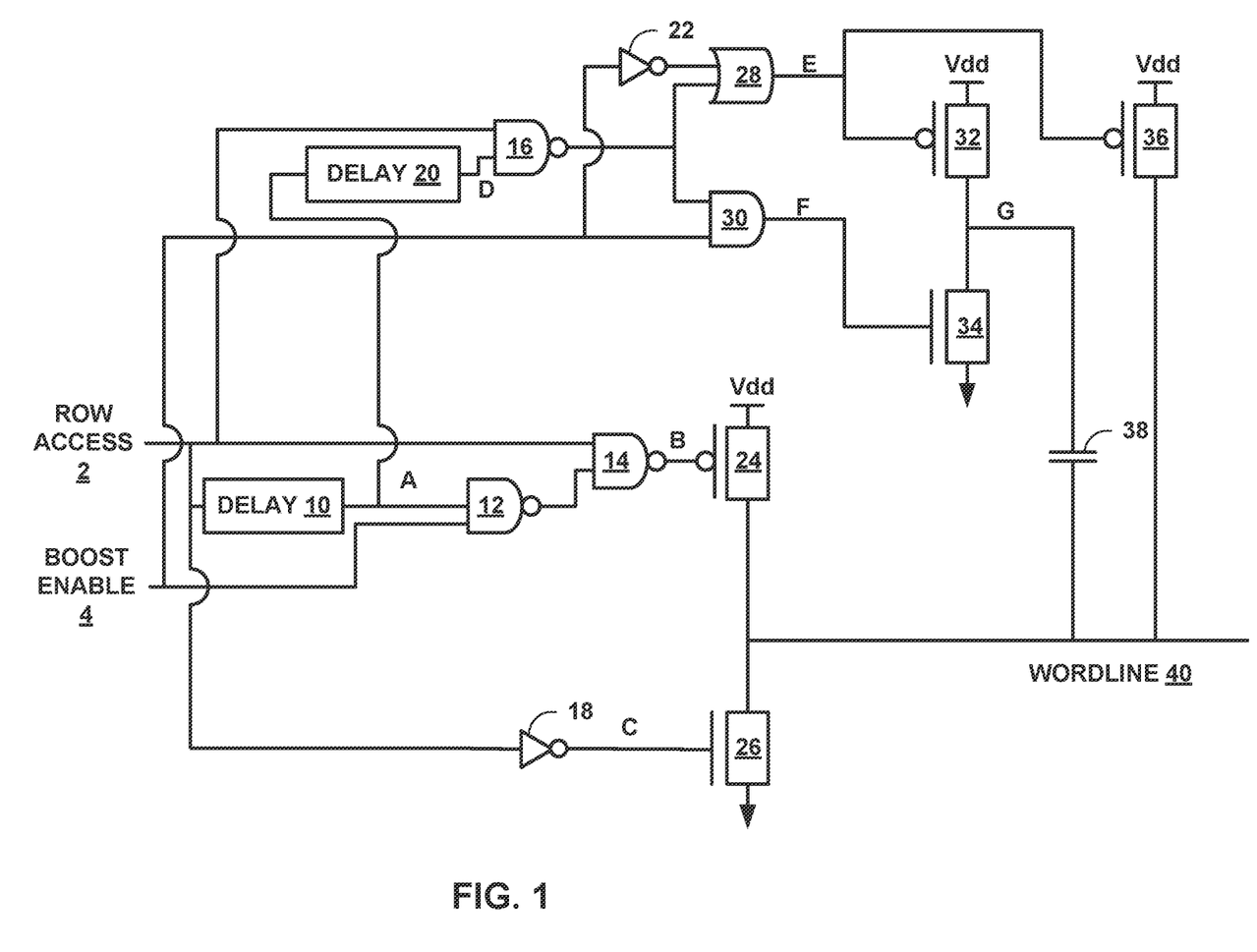
FIG. 1 is a circuit diagram of an example wordline driver circuitry and boost driver circuitry according to the techniques of this disclosure.

In some examples, each wordline driver may have wordline driver circuitry and boost driver circuitry. In other examples, boost driver circuitry may be shared among a plurality of wordline driver circuitries. FIG. 1 is a circuit diagram of example wordline driver circuitry and boost driver circuitry according to the techniques of this disclosure. In the example of FIG. 1, row access line 2, which may be used to access an associated row of memory cells for a write or a read operation, is coupled to delay circuitry 10, an input of NAND gate 14, an input of NAND gate 16, and the input of NOT gate 18. As used herein, the word "coupled" may refer to being electrically coupled. A boost enable line 4, which may be used to enable the boost voltage Vb over a drain voltage Vdd, is coupled to an input of NAND gate 12, an input to AND gate 30, and the input to NOT gate 22. The output of delay circuitry 10 is coupled to an input to NAND gate 12 and to the input of delay circuitry 20. The output of NAND gate 12 is coupled to an input of NAND gate 14. The output of NAND gate 14 is coupled to the gate of PMOS transistor 24. The output of NOT gate 18 is coupled to the gate of NMOS transistor 26. The drain of PMOS transistor 24 and the drain of NMOS transistor 26 are coupled to wordline 40.

The output of delay circuitry 20 is coupled to an input of NAND gate 16. The output of NAND gate 16 is coupled to an input of OR gate 28 and to an input of AND gate 30. The output of NOT gate 22 is coupled to an input to OR gate 28. The output of AND gate 30 is coupled to the gate of NMOS transistor 34. The output of OR gate 28 is coupled to the gate of PMOS transistor 32 and the gate of PMOS transistor 36. PMOS transistor 36 is activated to drain voltage Vdd in boost mode after the second delay to provide a controlled decay from boosted voltage Vb to Vdd and to hold at drain voltage Vdd indefinitely. In some examples, the controlled decay may be a constant rate of decay. In other examples, the controlled decay may be a non-constant rate of decay.

The drain of PMOS transistor 32 and the drain of NMOS transistor 34 are coupled to one side of boost capacitor 38. The other side of boost capacitor 38 is coupled to wordline 40.

Assertion of row access line 2, asserts wordline 40. A boost enable signal on boost enable line 4 selects between a drain voltage Vdd mode when low or boost mode (with boosted voltage Vb on the wordline being higher than drain voltage Vdd) when high. In boost mode, assertion of row access line 2 causes wordline 40 to be charged to Vdd during a first delay Tdelay1, which corresponds to the delay caused by delay circuitry 10. At the expiration of the first delay Tdelay1, the wordline Vdd driver (e.g., PMOS transistor 24) is disabled and a second delay Tdelay2, which corresponds to the delay caused by delay circuitry 20, is started to provide time for non-overlap between the wordline driver circuitry attempting to output drain voltage Vdd on wordline 40 or boosted voltage Vb on wordline 40. The capacitance across boost capacitor 38 is precharged to drain voltage Vdd. In other words, boost capacitor is charged to drain voltage Vdd prior to boost enable line 4 being asserted. At expiration of Tdelay2, the PMOS transistor 32 and NMOS transistor 34 (both of which may be a part of boost driver circuitry) drive boost capacitor 38 to create boosted voltage Vb at wordline 40. For example, boosted voltage Vb may be drain voltage Vdd plus a stored voltage of boost capacitor 38. Deassertion of row access line 2 deasserts the wordline driving the wordline low and precharges boost capacitor 38.

Figure 2:
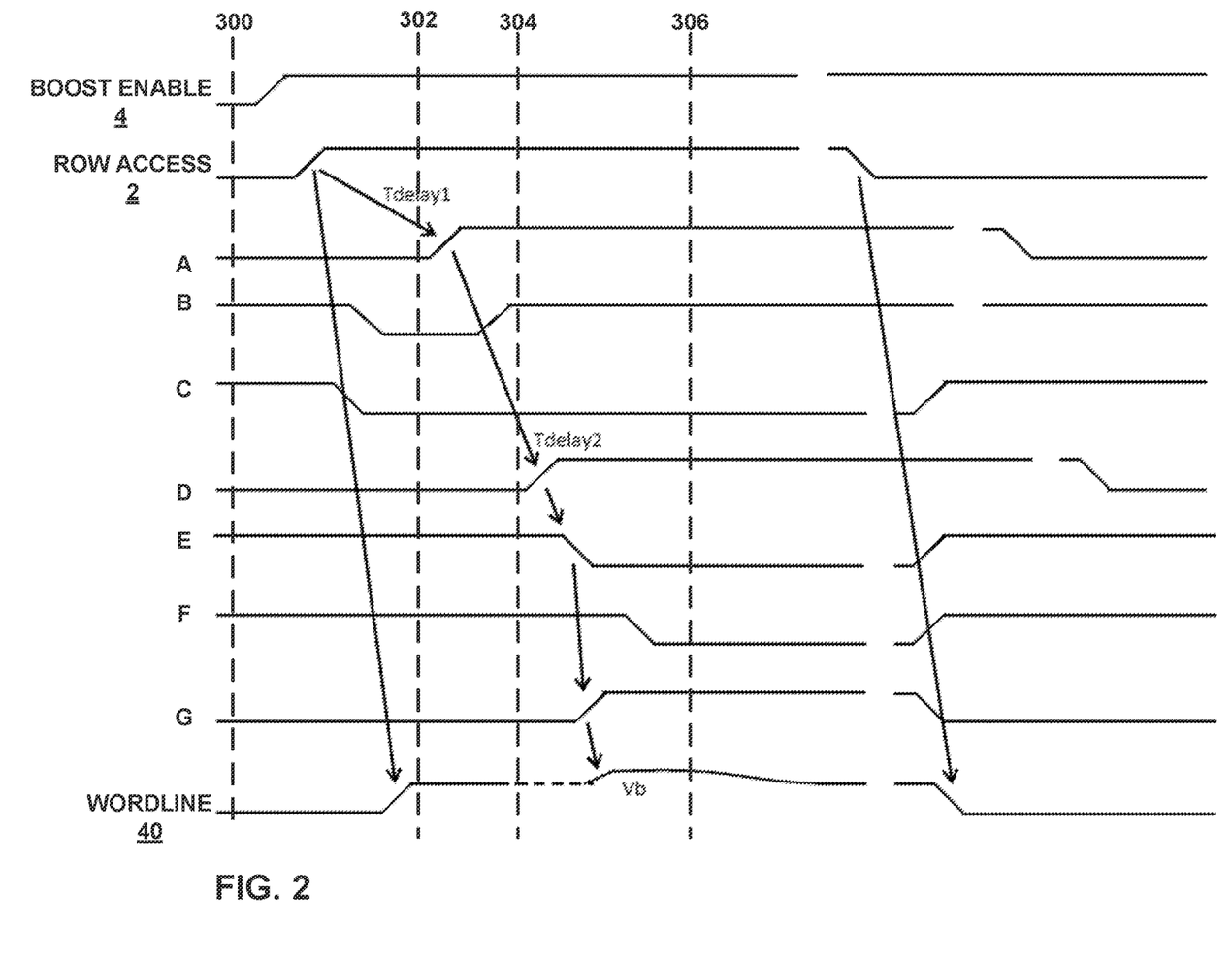
FIG. 2 is a conceptual diagram depicting example signals at locations in the wordline driver of FIG. 1 over time.

FIG. 2 is a conceptual diagram depicting example signals at locations in FIG. 1 over time. At time 300, prior to boost enable line 4 or row enable line 2 being asserted, the voltage at location A is low. The output of NAND gate 12 is high and the output of NAND gate 14 (location B) is high. Thus, PMOS transistor 24 is off. The input to NOT gate 18 is low and the output of NOT gate 18 (location C) is high. Thus, NMOS transistor 26 is on and wordline 40 is low. The voltage at location D is also low. The output of NAND gate 16 is high. The input to NOT gate 22 is low, so the output of NOT gate 22 is high. Therefore, the voltage at location E is high. With the voltage at location E being high. PMOS transistor 32 and PMOS transistor 36 are off. As the boost enable voltage is low, the output of AND gate 30 (location F) is low. With the voltage at location F being low, NMOS transistor 34 is off.

In the example of FIG. 2, when boost enable line 4 is asserted (e.g., goes high), boost mode is selected. Row access line 2 is asserted, for example, on the next write cycle. In this manner both boost enable line 4 and row access line 2 are high at time 302 before Tdelay1 expires. With the row access line 2 voltage being high and being input into NOT gate 18, NOT gate 18 outputs a low voltage to location C, turning off NMOS transistor 26.

The input to NAND gate 12 from delay circuitry 10 (location A) before the first delay Tdelay1 expires is still low. Tdelay1 may be associated with delay circuitry 10. With the row access line 2 signal being high and the output of delay circuitry 10 still low, the output of NAND gate 12 is high. With the row access line 2 signal high and the output of NAND gate 12 being high, the output of NAND gate 14 (location B) is low. Thus, PMOS transistor 24 is on bringing wordline 40 to drain voltage Vdd. While PMOS transistor 24 is on and the voltage at location G is low, PMOS transistor 24 precharges boost capacitor 38 to drain voltage Vdd (e.g., at time 302 through time 304).

When first delay Tdelay1 expires, the voltage at location A goes high so the voltage at location A is high at time 304 prior to the expiration of the second delay. The voltage at location A going high causes the output of NAND gate 12 to go low, which in turn causes the output of NAND gate 14 to go high (as the row access line 2 voltage is still high), turning off PMOS transistor 24. The voltage at location A going high also causes beginning of second delay Tdelay2 associated with delay circuitry 20. Prior to second delay Tdelay2 (which may be associated with delay circuitry 20) expiring, the output of NAND gate 16 is high (e.g., 1), as the row access voltage is high and the voltage at location D is low. Once delay Tdelay2 expires, the voltage at location D goes high and the output of NAND gate 16 changes to low.

Prior to the expiration of second delay Tdelay2, the boost enable voltage is high and the output of NOT gate 22 is low. The output of NAND gate 16 is high. Therefore, the output of OR gate 28 (location E) is high. Similarly, the output of AND gate 30 is high as both inputs are high. Thus, the voltage at location G remains low as NMOS transistor 34 is on and PMOS transistor 32 is off.

When Tdelay2 expires and the output of NAND gate 16 goes low, the output of OR gate 28 (location E) changes to low as both inputs to OR gate 28 are low. Additionally, the output of AND gate 30 (location F) also changes to low as one of AND gate 30's inputs is low. The output of OR gate 28 and AND gate 30 are low at time 306 when wordline 40 is at a boosted voltage.

With the voltage at locations E and F at low being applied to the gates of PMOS transistor 32 and NMOS transistor 34, the voltage at location G goes high as NMOS transistor 34 is turned off and PMOS transistor 32 is turned on. Because PMOS transistor 24 precharged boost capacitor 38 and the voltage on wordline 40 was at the drain voltage Vdd, the voltage at location G being high drives the voltage on wordline 40 to rise above Vdd to Vb (e.g., 2×Vdd), thereby boosting the voltage on wordline 40. When the voltage goes low at location E, PMOS transistor 36 turns on and creates a controlled decay from the boosted voltage Vb on wordline 40 back to the drain voltage Vdd. This provision of a controlled decay from the boosted voltage Vb back to the drain voltage Vdd may protect memory cells and associated circuitry from damage that may occur with sustained higher voltages. As mentioned above, the gate oxides for PMOS transistors have become very small such that the operating voltages are generally lower than one volt. Sustained higher voltages may damage the transistors.

Figure 3:
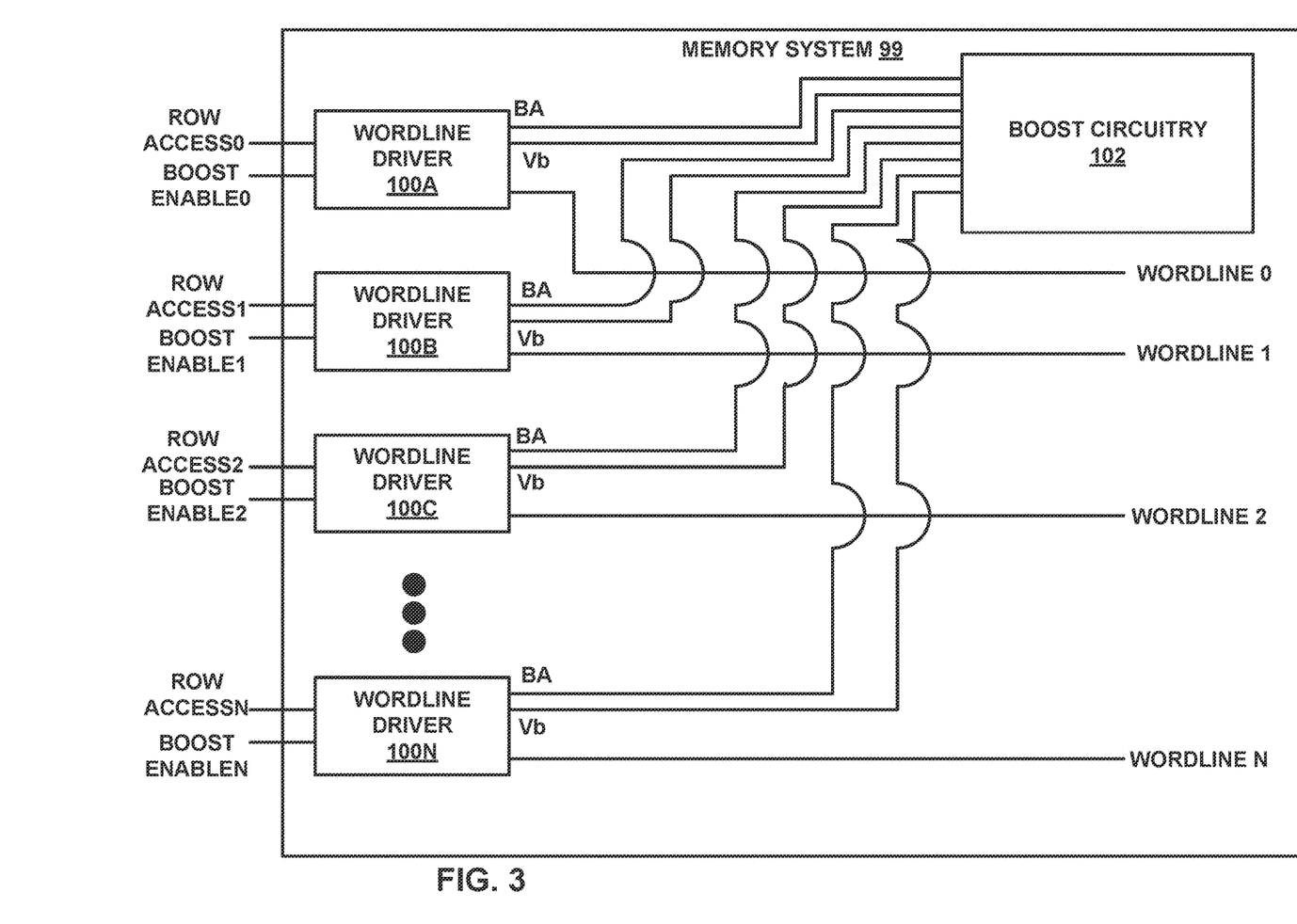
FIG. 3 is a block diagram illustrating another example apparatus for writing a bit to a memory cell according to the techniques of this disclosure.

FIG. 3 is a block diagram illustrating another example memory system for writing a bit to a memory cell according to the techniques of this disclosure. In the example of FIG. 3, boost driver circuitry 102 of memory system 99 is shared among a plurality of wordline driver circuitries. By implementing an apparatus in which wordline driver circuitries share boost driver circuitry 102, fewer capacitors may be used which may reduce a size of the apparatus. A plurality of wordline driver circuitries (100A-100N) are coupled to boost driver circuitry 102. In this example, N may be any positive integer number. A respective row access line and boost enable line are coupled to each of the wordline driver circuitries. For example, row access0 and boost enable0 are coupled to wordline driver circuitry 100A, row access1 and boost enable1 are coupled to wordline driver circuitry 100B, row access2 and boost enable2 are coupled to wordline driver circuitry 100C, and row accessN and boost enableN are coupled to wordline driver circuitry 100N. Each row access line may carry a signal for accessing the respective row in memory, such as during a write or read operation. Each boost enable line may carry a signal enabling boost mode for the respective wordline.

Each wordline driver outputs a respective wordline (wordline 0-wordline N) which are coupled to memory cells (not shown for simplicity purposes). Additionally each wordline driver is coupled to boost driver circuitry 102 through a boost access BA line and a Vb line which carries the boosted voltage from boost driver circuitry 102 to a wordline driver circuitry, such as one or more of wordline driver circuitries 100A-100N. Boost driver circuitry 102 may boost the voltage on line Vb to the boost voltage Vb for a particular wordline when the boost enable signal for that wordline is high.

In the example of FIG. 3, assertion of a row access input asserts the corresponding wordline. For example, assertion of row access0 asserts wordline0, assertion of row access1 asserts wordline1, assertion of row access2 asserts wordline2, and assertion of row access N asserts wordlineN. The boost enable input for that row selects between drain voltage Vdd mode where the wordline is at drain voltage Vdd or boost mode where the wordline is at boosted voltage Vb. For example, assertion of boost enable0 selects the boost mode for wordline0, assertion of boost enable1 selects the boost mode for wordline1, assertion of boost enable2 selects the boost mode for wordline2, and assertion of boost enableN selects the boost mode for wordlineN. In boost mode, assertion of the corresponding row access input causes the wordline to be charged to drain voltage Vdd during first delay Tdelay1.

At expiration of first delay Tdelay1, the wordline Vdd driver is disabled and a second delay Tdelay2 is started to provide time for non-overlap between the wordline driver circuitry attempting to output drain voltage Vdd on a wordline or boosted voltage Vb on the wordline. In boost driver circuitry 102, a boost capacitor's capacitance is precharged to drain voltage Vdd. At expiration of Tdelay2, boost driver circuitry 102 drives the boost capacitor to create boosted voltage Vb at line Vb for the appropriate wordline driver circuitry. Also, a boost transfer device for the selected wordline is enabled and transfers the boosted voltage Vb to the wordline. Deassertion of the row access input deasserts the wordline and precharges the boost capacitor. A small "keeper" device on the wordline is activated to drain voltage Vdd in boost mode to provide controlled decay from boosted voltage Vb to drain voltage Vdd and to hold at drain voltage Vdd indefinitely.

Figure 4:
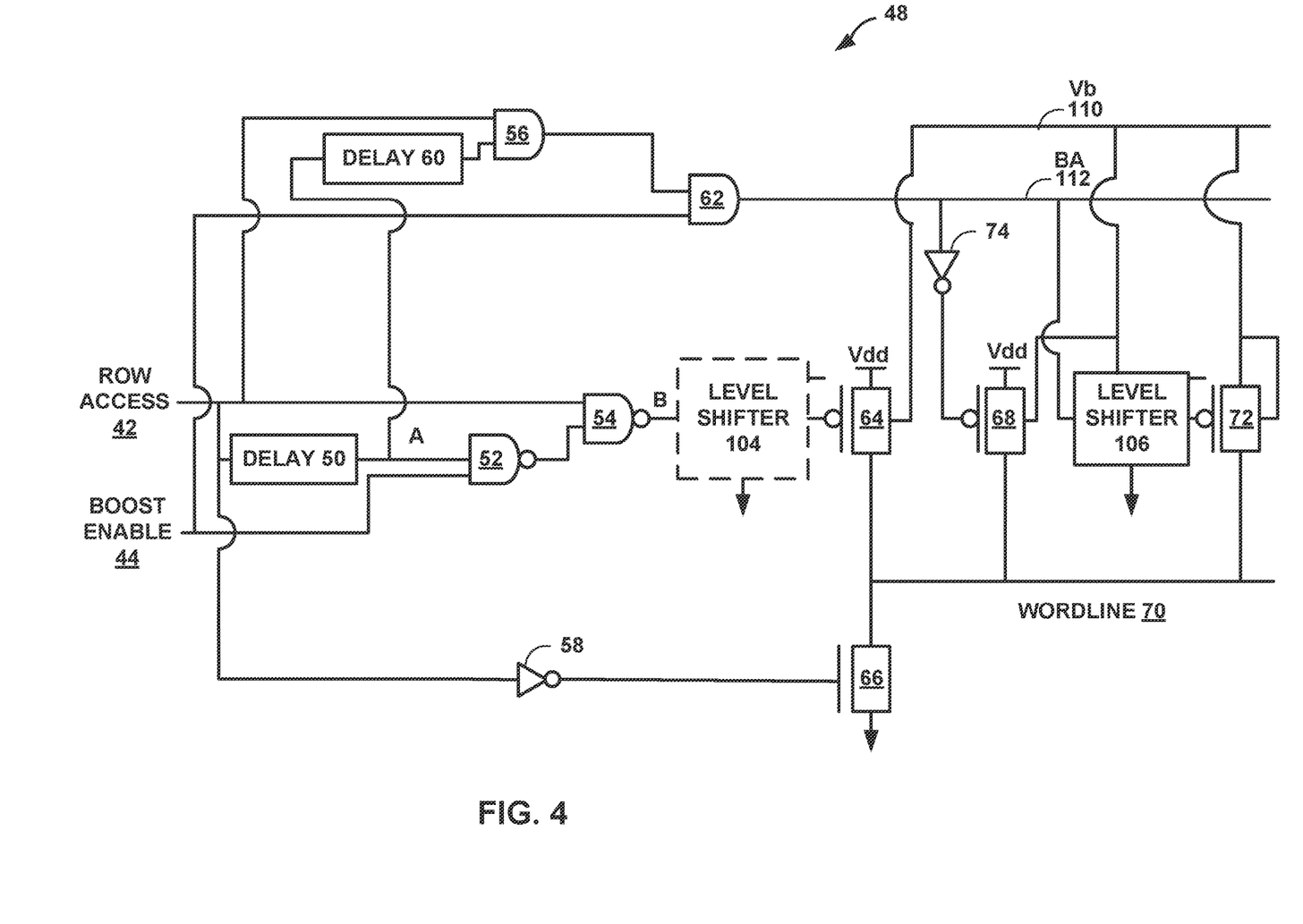
FIG. 4 is a circuit diagram of example wordline driver circuitry according to the techniques of this disclosure.

FIG. 4 is a circuit diagram of example wordline driver circuitry according to the techniques of this disclosure. Wordline driver circuitry 48 may be an example of any of wordline driver circuitries 100A-100N in FIG. 3. In the example of FIG. 4, row access line 42 is coupled to an input of NAND gate 54, delay circuitry 50, the input of NOT gate 58 and an input of AND gate 56. Boost enable line 44 is coupled to an input of AND gate 62 and an input of NAND gate 52. The output of delay circuitry 50 is coupled to an input of NAND gate 52 and an input of delay circuitry 60. The output of NAND gate 52 is coupled to an input of NAND gate 54. The output of NOT gate 58 is coupled to the gate of NMOS transistor 66. In some examples, the output of NAND gate 54 is coupled to the gate of PMOS transistor 64. In other examples, the output of NAND gate 54 is coupled to level shifter circuitry 104 (shown in dashed lines), in which case the output of level shifter circuitry 104 is coupled to the gate of PMOS transistor 64.

The output of delay 60 is coupled to an input of AND gate 56. The output of AND gate 56 is coupled to an input of AND gate 62. The drain of PMOS transistor 64 and the drain of NMOS transistor 66 are coupled to wordline 70. In the example of FIG. 4, NOT gate 74, which is coupled to the output of AND gate 62 and PMOS transistor 68 form a low drive keeper similar to PMOS transistor 36 of FIG. 1. In some examples, the low drive keeper may be part of boost driver circuitry 102 rather than wordline driver circuitry 48. Level shifter circuitry 106 is coupled to BA 112, PMOS transistor 68 and the complement output of level shifter circuitry is coupled to the gate of PMOS transistor 72. The true output of level shifter circuitry 106 (shown above the complement output) may not be used. The source of PMOS transistor 72 is coupled to Vb line 110, while the drain of PMOS transistor 72 is coupled to wordline 70. Both Vb line 110 and BA line 112 are coupled to boost driver circuitry 102 (not shown in FIG. 4 for simplicity purposes).

Because this example makes use of boost voltage Vb in excess of drain voltage Vdd, the body connections of the PMOS driver devices are connected to boost voltage line Vb rather than to a drain voltage line Vdd to avoid forward-bias. Also, level shifter circuitry may be used to communicate with the PMOS driver devices. A level shifter may be a circuit that may change the level of voltage from one level to another. In some examples, the gate of the Vdd wordline driver, PMOS transistor 64, is not connected to level shifter circuitry. In these examples, the gate of the Vdd wordline driver, PMOS transistor 64, is driven to drain voltage Vdd to effect a PMOS diode-clamp to limit the maximum output boosted voltage level to approximately drain voltage Vdd plus threshold voltage Vtp (Vdd+Vtp). In some examples, the gate of the Vdd wordline driver, PMOS transistor 64, may be driven by level shifter circuitry 104 to overcome the clamp effect. In the example where wordline driver circuitries share boost driver circuitry, for multi-port access, more than one row access input may be asserted simultaneously. More than one boost enable signal may also be asserted simultaneously, but this may imply a larger boost capacitor value.

Figure 5:
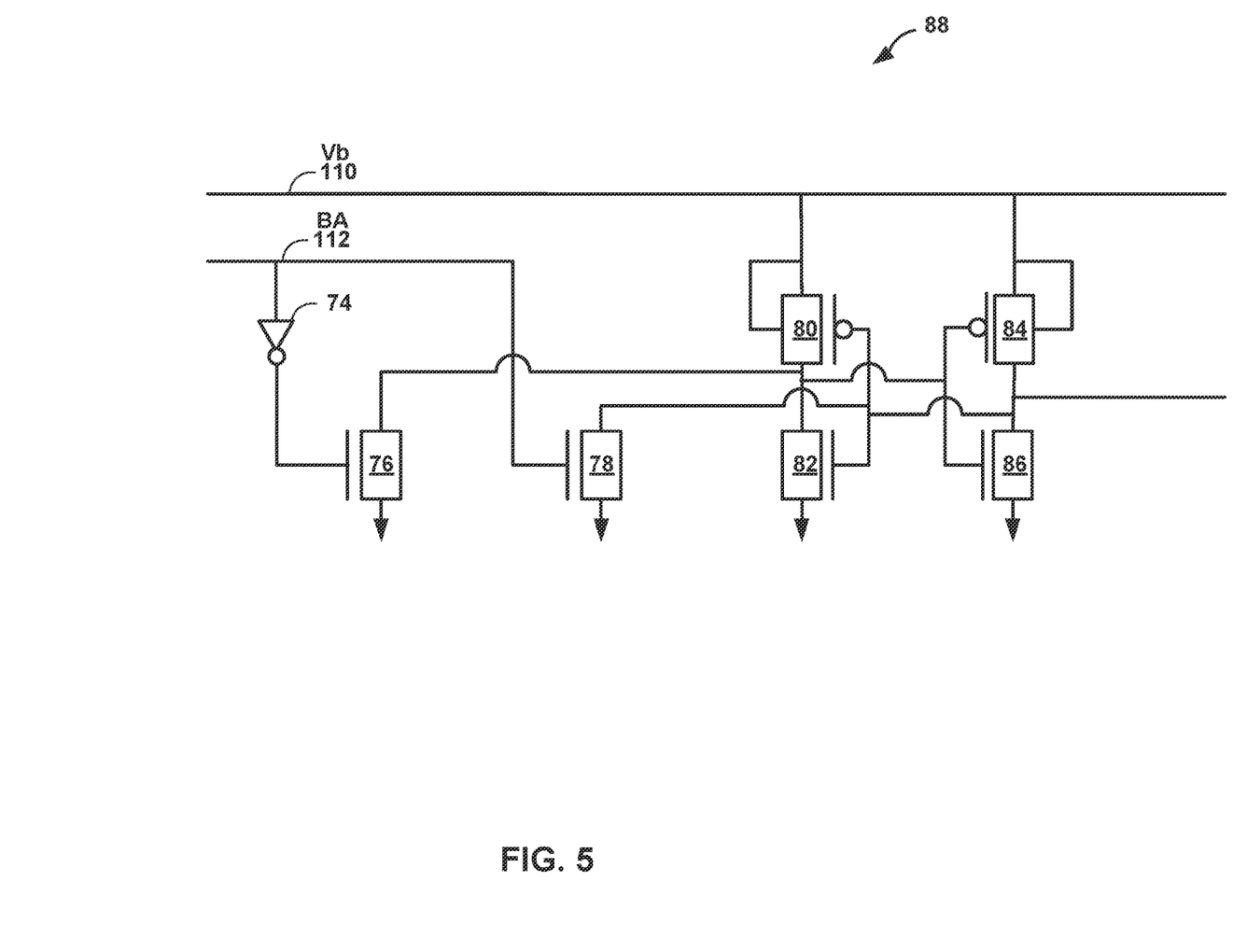
FIG. 5 is a circuit diagram of example level shifter circuitry according to the techniques of this disclosure.

FIG. 5 is a circuit diagram illustrating an example level shifter circuit according to the techniques of this disclosure. While one particular example is provided, other level shifter circuitry may be used according to the techniques of this disclosure. Level shifter circuitry 88 may be an example of level shifter circuitry 104 or level shifter 106 of FIG. 4. In the example of FIG. 5, BA line 112 is coupled to the input of NOT gate 74 whose output is coupled to the gate of NMOS transistor 76. BA line is also coupled to the gate of NMOS transistor 78. The drain of NMOS transistor 76 is coupled to the drain of PMOS transistor 80, the drain of NMOS transistor 82, and the gates of PMOS transistor 84 and NMOS transistor 86. The drain of NMOS transistor 78 is coupled to the gates of PMOS transistor 80 and NMOS transistor 82, the drain of PMOS transistor 84 and the drain of NMOS transistor 86. The drain of PMOS transistor 84 and the drain of NMOS transistor 86 are coupled to an output from level shifter circuitry 88. For example, this output may be coupled to a gate of a transistor, such as PMOS transistor 64 or PMOS transistor 72 of FIG. 4. Vb line 110 is coupled to the source of PMOS transistor 80 and the source of PMOS transistor 84.

Figure 6:
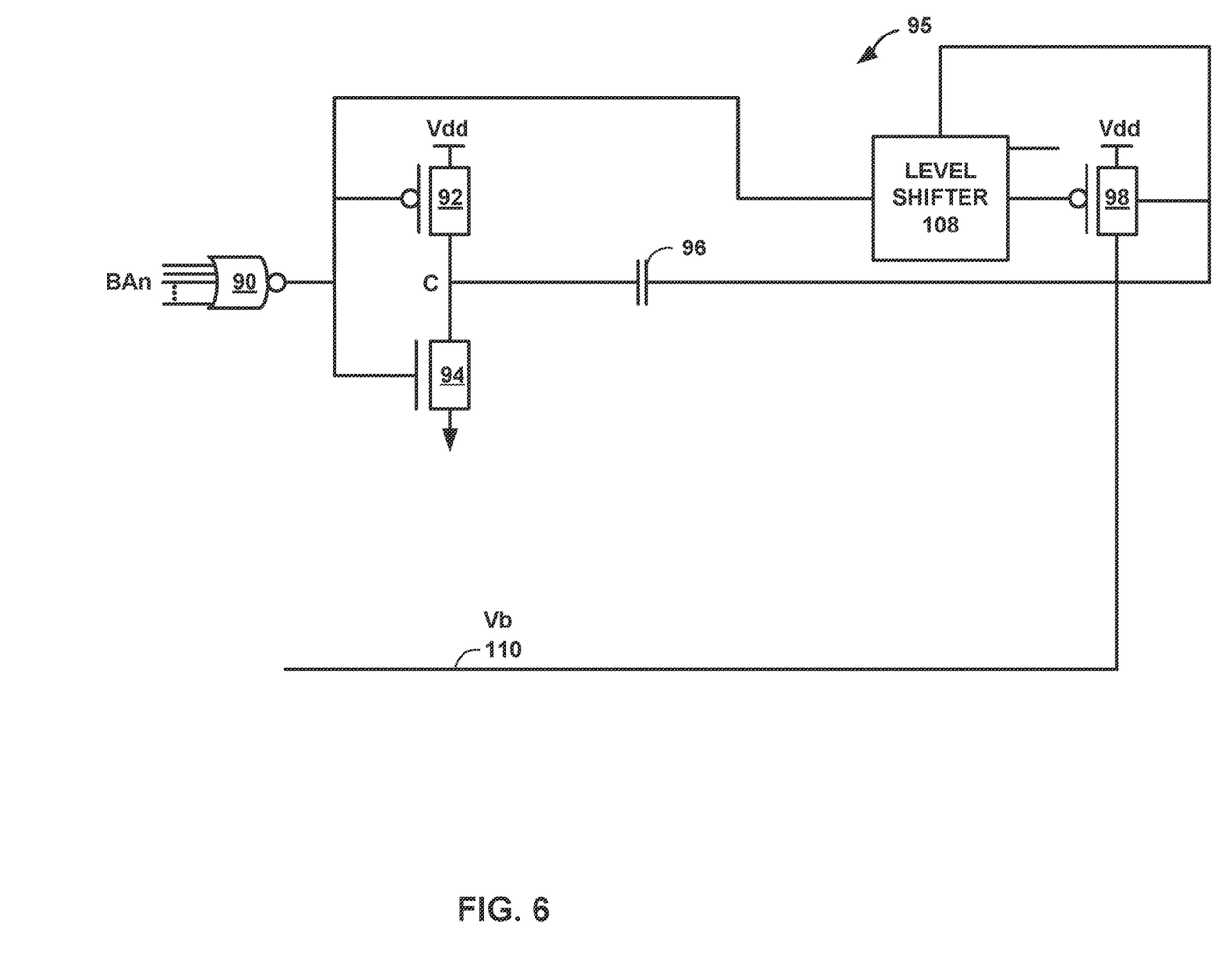
FIG. 6 is a circuit diagram of example boost driver circuitry according to the techniques of this disclosure.

FIG. 6 is a circuit diagram illustrating example boost driver circuitry according to the techniques of this disclosure. Boost driver circuitry 95 may be an example of boost driver circuitry 102 of FIG. 3. In the example of FIG. 6, boost enable signals from wordline driver circuitries, such as wordline driver circuitries 100A-100N, are coupled to NOR gate 90, which functions to select the boost mode when one of the wordline driver circuitry is seeks to enable the boost mode. The output of NOR gate 90 is coupled to the gate of PMOS transistor 92 and the gate of NMOS transistor 94 and to level shifter circuitry 108. Level shifter circuitry 108 may be an example of level shifter circuitry 88 of FIG. 5. The drain of PMOS transistor 92 is coupled to the drain of NMOS transistor 94 and one side of boost capacitor 96. The other side of boost capacitor 96 is coupled to the drain of PMOS transistor 98, the complement output of level shifter circuitry is coupled to the gate of PMOS transistor 72. The true output of level shifter circuitry (shown above the complement output) may not be used. The complement output of level shifter circuitry 108 is coupled to the gate of PMOS transistor 98. The true output of level shifter circuitry 108 (shown above the complement output) may not be used. The drain of PMOS transistor 98 may be coupled to an output from boost driver circuitry 95 that may be coupled to wordline driver circuitry, such as wordline driver circuitry 0 100A.

The described examples provide wordline driver circuitry configured to generate a first voltage in response to a row access enable signal. The examples provide boost driver circuitry coupled to the wordline driver circuitry and being configured to charge a capacitor using the first voltage and to generate a second voltage using the first voltage and a voltage at the capacitor in response to a boost enable signal, wherein the second voltage is higher than the first voltage. The examples also provide a wordline coupled to the memory cell and the wordline driver circuitry, the wordline being configured to output the first voltage or the second voltage to the memory cell. In the described examples, the wordline driver circuitry includes delay circuitry configured to output the first voltage at the wordline before expiration of a first delay from receiving the row access enable signal and to output the second voltage after expiration of a second delay from receiving the row access enable signal. While these described examples include the second voltage being higher than the first voltage (e.g., Vdd), in some examples, the second voltage may be another voltage levels, such as voltage levels between Vss and Vdd or voltage levels lower than Vss in accordance with the techniques of this disclosure.

Figure 7:
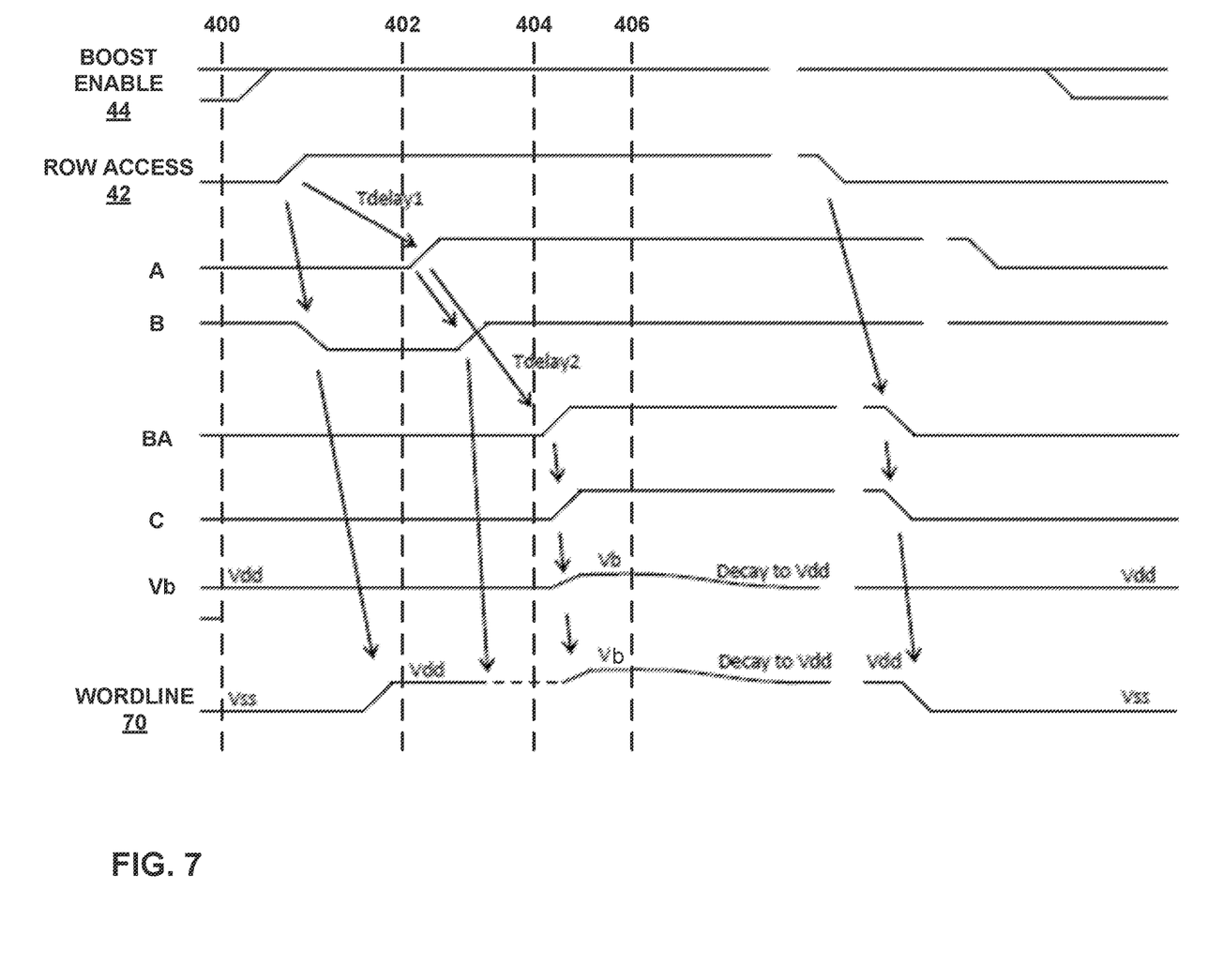
FIG. 7 is a conceptual diagram depicting example signals at locations in FIGS. 4 and 6 over time.

FIG. 7 is a conceptual diagram depicting example signals at locations in FIGS. 4 and 6 over time. As the circuitry of the example of FIG. 1 and the examples of FIGS. 4-6 are different, the example of FIG. 7 is different from the example of FIG. 2. At time 400, prior to boost enable line 44 or row access line 42 being asserted, the voltage at location A is low. The output of NAND gate 52 is high and the output of NAND gate 54 (location B) is high. Thus, PMOS transistor 64 is off. The input to NOT gate 58 is low and the output of NOT gate 58 is high. Thus, NMOS transistor 66 is on and wordline 70 is low.

The voltage at the output of delay 60 is also low. The output of AND gate 56 is low and the output of AND gate 62 is low. If all of the boost enable lines are low, the output of NOR gate 90 is high. Therefore, NMOS transistor 94 is on and PMOS transistor 92 is off. As NMOS transistor 94 is on and PMOS transistor 92 is off, the voltage at location C is low. The voltage at Vb line 110 is drain voltage Vdd as PMOS transistor 98 is on. Thus, boost capacitor 96 is being charged to drain voltage Vdd.

In the example of FIGS. 4 and 6, when a boost enable line 44 is asserted (e.g., goes high or 1), boost mode is selected. Row access line 42 is asserted, for example, on the next write cycle. With the row access voltage high being input into NOT gate 58, NOT gate 58 outputs a low voltage, turning off NMOS transistor 66.

The input to NAND gate 52 from delay circuitry 50 (location A) before the first delay Tdelay1 expires is still low. With the row access line 42 high and the output of delay circuitry 50 still low, the output of NAND gate 52 is high. With the row access signal high and the output of NAND gate 52 being high the output of NAND gate 54 (location B) is low. Thus, PMOS transistor 64 is on bringing wordline 70 to drain voltage Vdd, for example, at time 402.

When first delay Tdelay1 expires, the voltage at location A goes high. The voltage at location A going high causes the output of NAND gate 52 to go low, which in turn causes the output of NAND gate 44 (location B) to go high (as the row access voltage is still high), turning off PMOS transistor 64. The voltage at location A going high also causes beginning of second delay Tdelay2 associated with delay circuitry 60. Prior to second delay Tdelay2 expiring, the output of AND gate is low, as the row access voltage is high and the voltage at the output of delay 60 is still low. Once delay Tdelay2 expires (after time 404), the voltage at the input of AND gate 56 goes high and the output of AND gate 56 goes high. The output of AND gate 62 also goes high causing BA line 112 to go high.

When BA line 112 goes high, the output of NOR gate 90 goes low. When the output of NOR gate 90 goes low, NMOS transistor 94 is turned off and PMOS transistor 92 is turned on. This causes the voltage at location C to rise to drain voltage Vdd. As PMOS transistor 98 precharged boost capacitor 96 to drain voltage Vdd and the voltage on wordline 70 was at the drain voltage Vdd, the voltage at location C being high causes the voltage on wordline 70 to rise above drain voltage Vdd (e.g., 2×Vdd), thereby boosting the voltage on wordline 70. When the voltage goes low at the output of NOR gate 90, PMOS transistor 98 turns on and creates a controlled decay from the boosted voltage Vb on wordline 70 back to the drain voltage Vdd. This provision of a controlled decay from the boosted voltage Vb back to the drain voltage Vdd may protect memory cells and associated circuitry from damage that may occur with sustained higher voltages. In this manner, wordline driver circuitry 48 and boost driver circuitry 95 provide a boosted voltage on wordline 70 at time 406.

Figure 8:
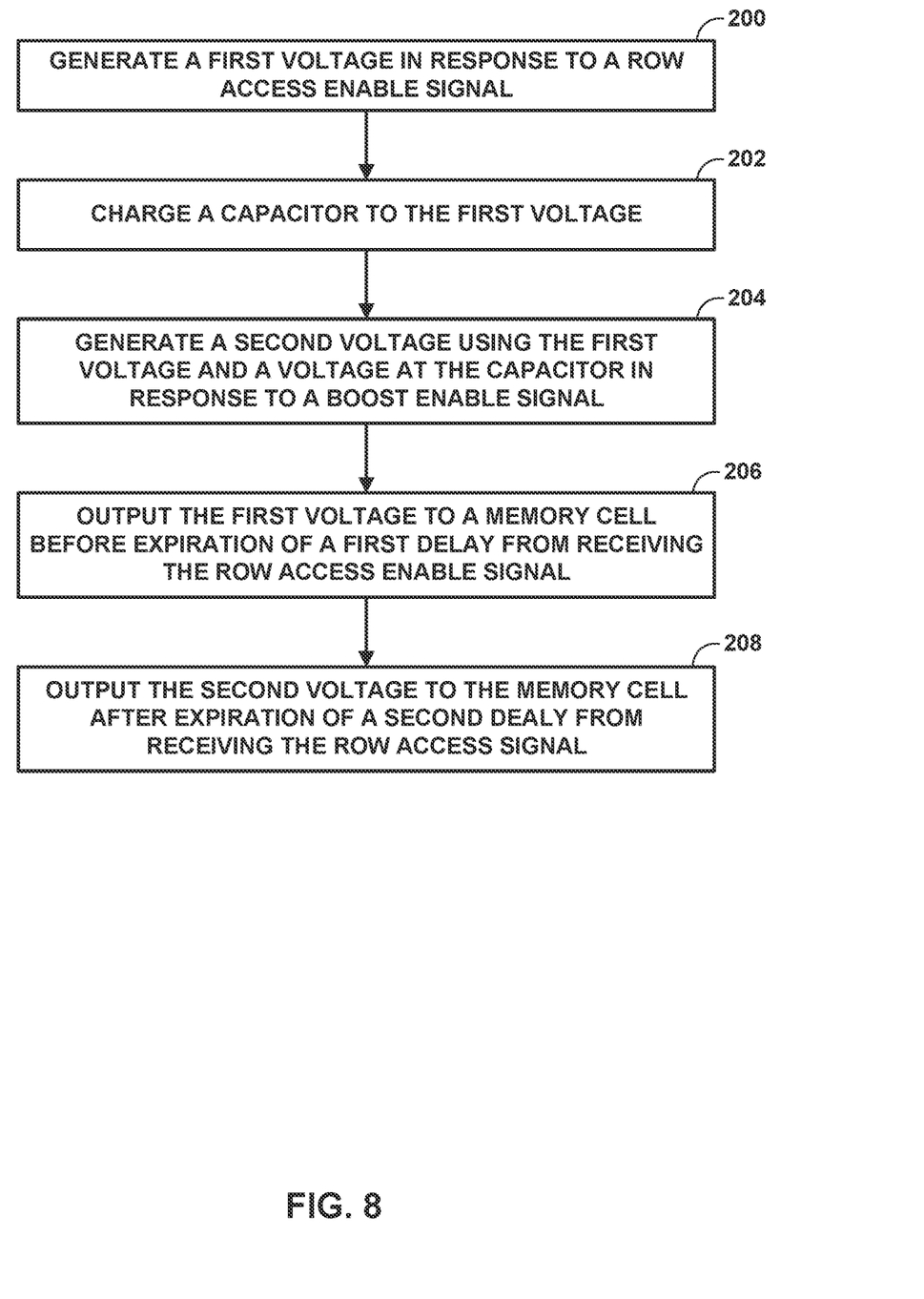
FIG. 8 is a flowchart illustrating example techniques for writing a bit to a memory cell according to this disclosure.

FIG. 8 is a flowchart illustrating example techniques for writing a bit to a memory cell according to this disclosure. Wordline driver circuitry 48 may generate a first voltage in response to a row access enable signal (200). For example, wordline driver circuitry 48 may receive a high signal on the row access line. The input to NAND gate 52 at location A of FIG. 4 remains low until the expiration of a first delay associated with delay circuitry 50. As NAND gate 52 has an input of low or 0, the output of NAND gate 52 is high or 1. Both inputs to NAND gate 54 are both high or 1 and the output of NAND gate 54 is low or 0. This then turns on PMOS transistor 64 to drive wordline 70 to the drain voltage Vdd.

Boost driver circuitry 95 may charge boost capacitor 96 using the first voltage (202). For example, prior to receiving a boost enable signal, level shifter circuitry 108 may turn PMOS transistor 98 on to charge boost capacitor 96 to drain voltage Vdd.

Boost driver circuitry 95 may generate a second voltage using the first voltage and a voltage at boost capacitor 96 in response to a boost enable signal (204). The second voltage may be higher than the first voltage. For example, NOR gate 90 of boost driver circuitry 95 may receive a boost enable signal. NOR gate 90 may output a low or 0 turning on PMOS transistor 92. With boost capacitor 96 already holding a voltage of Vdd, PMOS transistor 92 may cause the voltage on line Vb to become the drain voltage Vdd plus the charge voltage held by boost capacitor 96 (e.g., Vdd+Vdd).

Wordline 70 may output the first voltage to the memory cell before expiration of the first delay from receiving the row access enable signal (206). For example, as described above, wordline driver circuitry 48 may receive a high signal on the row access line. The input to NAND gate 52 at location A remains low until the expiration of a first delay associated with delay circuitry 50. As NAND gate 52 has an input of low or 0, the output of NAND gate 52 is high or 1. Both inputs to NAND gate 54 are both high or 1 and the output of NAND gate 54 is low or 0. This then turns on PMOS transistor 64 to drive wordline 70 to the drain voltage Vdd. Once the first delay associated with delay 50 expires, the signal at location A is high and if a boost enable signal is also high, the output of NAND gate 52 would go low which in turn would drive the output of NAND gate 54 high, turning off PMOS transistor 64 after the first delay. The first delay provides time for the PMOS transistor 64 to drive wordline 70 to drain voltage Vdd prior to turning off PMOS transistor 64.

Wordline 70 may output the second voltage to the memory cell after expiration of a second delay from receiving the row access enable signal (208). For example, after the second delay associated with delay circuitry 60 the output of AND gate 56 may go from low to high. The second delay may provide a time to avoid an overlap of PMOS transistor 64 driving wordline 70 to drain voltage Vdd and boost driver circuitry 95 driving wordline 70 to Vb. If the boost enable signal is also high, the output of AND gate 62 may go high at location BA. This may cause the output of NOR gate 90 of boost driver circuitry 95 to be low which turns on PMOS transistor 92, bringing the voltage at location C to the drain voltage Vdd. With boost capacitor 96 already holding a voltage of Vdd, PMOS transistor 92 may cause the voltage on line Vb to become the drain voltage Vdd plus the charge voltage held by boost capacitor 96 (e.g., Vdd+Vdd). Level shifter 106 of may turn on PMOS transistor 72 thereby transferring the voltage on line Vb to wordline 70.

In some examples, wordline driver circuitry 48 includes a first transistor (e.g., PMOS transistor 72) having a first gate and first level shifter circuitry (e.g., level shifter circuitry 106) coupled to the first gate. The first level shifter circuitry may drive the first transistor of the wordline driver circuitry to transfer the second voltage (e.g., boost voltage Vb) to wordline 70.

In some examples, wordline driver circuitry 48 includes a second transistor (e.g., PMOS transistor 64) having a second gate and second level shifter circuitry (e.g., level shifter circuitry 104). The second level shifter circuitry may be coupled to the second gate of the second transistor and may be configured to drive the second transistor of the wordline driver circuitry to overcome a PMOS diode-clamp. In some examples, the second transistor is a drain voltage transistor configured to drive the wordline to the first voltage (e.g., drain voltage Vdd).

In some examples, boost driver circuitry 95 comprises a transistor (e.g., PMOS transistor 98) and level shifter circuitry (e.g., level shifter circuitry 108). In some examples, the level shifter circuitry drives the transistor to charge boost capacitor 96 to the first voltage prior to the boost drive circuitry receiving the boost enable signal.

In some examples, the wordline driver circuitry includes low-drive drain voltage keeper circuitry (e.g., NOT gate 74 and PMOS transistor 68). In other examples, the boost drive circuitry includes the low-drive drain voltage keeper circuitry. The low-drive drain voltage keeper circuitry may output a voltage to wordline 70 that is at least the first voltage (e.g., drain voltage Vdd).

In some examples, the wordline driver circuitry is first wordline driver circuitry, the row access enable signal is a first row access enable signal, the wordline is a first wordline and the memory cell is a first memory cell. In some examples, second wordline driver circuitry (e.g., wordline driver circuitry 100B) generates the first voltage in response to a second row access enable signal (e.g., row access1). A second wordline (e.g., wordline 1) is coupled to a second memory cell and the second wordline driver circuitry, outputs the first voltage (e.g., drain voltage Vdd) to the second memory cell before expiration of the first delay (e.g., Tdelay1) from receiving the second row access enable signal. The second wordline outputs the second voltage to the second memory cell after expiration of the second delay (e.g., Tdelay 2) from receiving the second row access enable signal.

Various examples of the disclosure have been described. These and other examples are within the scope of the following claims.

What is claimed is:

1. An apparatus for writing a bit to a memory cell, the apparatus comprising:
   wordline driver circuitry configured to generate a first voltage in response to a row access enable signal;
   boost driver circuitry coupled to the wordline driver circuitry and being configured to charge a capacitor using the first voltage and to generate a second voltage using the first voltage and a voltage at the capacitor in response to a boost enable signal, wherein the second voltage is higher than the first voltage; and
   a wordline coupled to the memory cell and the wordline driver circuitry, the wordline being configured to output the first voltage or the second voltage to the memory cell,
   wherein the wordline driver circuitry comprises delay circuitry configured to output the first voltage at the wordline before expiration of a first delay from receiving the row access enable signal and to output the second voltage after expiration of a second delay from receiving the row access enable signal, and wherein the boost driver circuitry comprises a boost driver transistor having a gate and level shifter circuitry coupled to the gate, the level shifter circuitry being configured to drive the boost driver transistor to charge the capacitor to the first voltage prior to the boost driver circuitry receiving the boost enable signal.

2. The apparatus of claim 1, wherein the wordline driver circuitry further comprises:
   a first transistor having a first gate; and
   first level shifter circuitry coupled to the first gate of the first transistor, the first level shifter circuitry configured to drive the first transistor to transfer the second voltage to the wordline.

3. The apparatus of claim 1, wherein the wordline driver circuitry comprises:
   a second transistor having a second gate, the second transistor being configured to effect a PMOS diode-clamp; and
   a second level shifter circuitry coupled to the second gate of the second transistor, the second level shifter circuitry being configured to drive the second transistor to overcome the PMOS diode-clamp.

4. The apparatus of claim 3, wherein the second transistor is a drain voltage driver transistor configured to drive the wordline to the first voltage.

5. The apparatus of claim 1, wherein the wordline driver circuitry comprises low-drive drain voltage keeper circuitry configured to output a voltage to the wordline that is at least the first voltage.

6. The apparatus of claim 1, further comprising low-drive drain voltage keeper circuitry configured to output a voltage to the wordline that is at least the first voltage.

7. The apparatus of claim 1, wherein the wordline driver circuitry is first wordline driver circuitry, the row access enable signal is a first row access enable signal, the wordline is a first wordline and the memory cell is a first memory cell, the apparatus further comprising:
   second wordline driver circuitry configured to generate the first voltage in response to a second row access enable signal, the second wordline driver being coupled to the boost driver circuitry; and
   a second wordline coupled to a second memory cell and the second wordline driver circuitry, the second wordline being configured to output the first voltage or the second voltage to the second memory cell, wherein the second wordline driver circuitry comprises second delay circuitry configured to output the first voltage at the second wordline before expiration of the first delay from receiving the second row access enable signal and to output the second voltage after expiration of the second delay from receiving the second row access enable signal.

8. A method for writing a bit to a memory cell, the method comprising:

generating, by wordline driver circuitry, a first voltage in response to a row access enable signal;

charging, by boost driver circuitry, a capacitor using the first voltage;

generating, by the boost driver circuitry, a second voltage using the first voltage and a voltage at the capacitor in response to a boost enable signal, wherein the second voltage is higher than the first voltage, wherein the boost driver circuitry comprises a boost driver transistor having a gate and level shifter circuitry coupled to the gate, the level shifter circuitry being configured to drive the boost driver transistor to charge the capacitor to the first voltage prior to the boost driver circuitry receiving the boost enable signal;

outputting, by a wordline coupled to the memory cell and the wordline driver circuitry, the first voltage to the memory cell before expiration of a first delay from receiving the row access enable signal; and outputting, by the wordline, the second voltage to the memory cell after expiration of a second delay from receiving the row access enable signal.

9. The method of claim 8, wherein the wordline driver circuitry comprises a first transistor and first level shifter circuitry, the method further comprising driving, by the first level shifter circuitry, the first transistor of the wordline driver circuitry to transfer the second voltage to the wordline.

10. The method of claim 8, wherein the wordline driver circuitry comprises a second transistor and second level shifter circuitry, the method further comprising driving, by the second level shifter circuitry, the second transistor of the wordline to overcome a PMOS diode-clamp.

11. The method of claim 10, wherein the second transistor is a drain voltage driver transistor configured to drive the wordline to the first voltage.

12. The method of claim 8, wherein the wordline driver circuitry comprises low-drive drain voltage keeper circuitry, the method further comprising outputting, by the low-drive drain voltage keeper circuitry, a voltage to the wordline that is at least the first voltage.

13. The method of claim 8, wherein an apparatus comprising the wordline driver circuitry comprises low-drive drain voltage keeper circuitry, the method further comprising outputting, by the low-drive drain voltage keeper circuitry, a voltage to the wordline that is at least the first voltage.

14. The method of claim 8, wherein the wordline driver circuitry is first wordline driver circuitry, the row access enable signal is a first row access enable signal, the wordline is a first wordline and the memory cell is a first memory cell, the method further comprising:

generating, by second wordline driver circuitry, the first voltage in response to a second row access enable signal;

outputting, by a second wordline coupled to a second memory cell and the second wordline driver circuitry, the first voltage to the second memory cell before expiration of the first delay from receiving the second row access enable signal; and outputting, by the second wordline, the second voltage to the second memory cell after expiration of the second delay from receiving the second row access enable signal.

15. A memory system comprising:

a capacitor;

wordline driver circuitry configured to generate a first voltage in response to a row access enable signal;

boost driver circuitry coupled to the wordline driver circuitry and the capacitor and being configured to charge the capacitor using the first voltage and to generate a second voltage using the first voltage and a voltage at the capacitor in response to a boost enable signal, wherein the second voltage is higher than the first voltage; and a wordline coupled to a memory cell and the wordline driver circuitry, the wordline being configured to output the first voltage or the second voltage to the memory cell, wherein the wordline driver circuitry comprises delay circuitry configured to output the first voltage at the wordline before expiration of a first delay from receiving the row access enable signal and to output the second voltage after expiration of a second delay from receiving the row access enable signal, and wherein the boost driver circuitry comprises a transistor having a gate and level shifter circuitry coupled to the gate, the level shifter circuitry being configured to drive the transistor to charge the capacitor to the first voltage prior to the boost driver circuitry receiving the boost enable signal.

16. The memory system of claim 15, wherein the wordline driver circuitry further comprises:

a first transistor having a first gate; and first level shifter circuitry coupled to the first gate of the first transistor, the first level shifter circuitry configured to drive the first transistor to transfer the second voltage to the wordline.

17. The memory system of claim 15, wherein the wordline driver circuitry is first wordline driver circuitry, the row access enable signal is a first row access enable signal, the wordline is a first wordline and the memory cell is a first memory cell, the apparatus further comprising:

second wordline driver circuitry configured to generate the first voltage in response to a second row access enable signal, the second wordline driver being coupled to the boost driver circuitry; and a second wordline coupled to a second memory cell and the second wordline driver circuitry, the second wordline being configured to output the first voltage or the second voltage to the second memory cell, wherein the second wordline driver circuitry comprises second delay circuitry configured to output the first voltage at the second wordline before expiration of the first delay from receiving the second row access enable signal and to output the second voltage after expiration of the second delay from receiving the second row access enable signal.

* * * * *